United States Patent [19]

Bartky

[11] Patent Number: 5,028,812

[45] Date of Patent: Jul. 2, 1991

[54] MULTIPLEXER CIRCUIT

[75] Inventor: W. Scott Bartky, Chicago, Ill.

[73] Assignee: Xaar Ltd., Cambridge, England

[21] Appl. No.: 352,089

[22] Filed: May 12, 1989

[30] Foreign Application Priority Data

May 13, 1988 [GB] United Kingdom ................. 8811458

[51] Int. Cl.[5] ........................ H03K 17/56; H02M 3/18

[52] U.S. Cl. ...................................... 307/246; 307/242; 307/243; 307/110

[58] Field of Search ................................ 307/241-242, 307/246, 109, 110, 243, 244; 328/105, 752, 154, 137, 59, 67, 71, 74, 78

[56] References Cited

U.S. PATENT DOCUMENTS

| | | | |
|---|---|---|---|
| 3,048,766 | 8/1962 | Panzer | 307/110 |
| 3,588,748 | 6/1971 | Inaba | 307/241 |
| 3,710,142 | 1/1973 | Yokoyama | 307/242 |
| 3,867,645 | 2/1975 | Weimer | 307/242 |
| 3,927,334 | 12/1975 | Callahan | 307/246 |
| 4,124,806 | 11/1978 | Rusznyak | 307/246 |
| 4,511,814 | 4/1985 | Matsuo et al. | 307/242 |
| 4,656,574 | 4/1987 | Salchli | 307/110 |

*Primary Examiner*—Stanley D. Miller

*Assistant Examiner*—Toan Tran

[57] ABSTRACT

A multiplexer circuit for effecting, in successive phases of operation, actuation of selected ones of respective groups of a plurality of capacitance actuated devices electrically represented by a plurality of series-connected capacitors, each device corresponding to an adjacent pair of the capacitors. The multiplexer includes a signal generator and a plurality of parallel electrical paths connected thereacrosss. Each path includes the common node formed by the capacitor pair corresponding to a respective one of the devices and first and second switches. A logic circuit is initially operable for respectively closing and opening the first and second switches of a selected path in one group and respectively opening and closing the first and second switches of the paths adjacent thereto for charging the two capacitors connected to the selected path. The logic circuit is subsequently operable for respectively opening and closing the first second switches of the selected path for discharging the two capacitors to effect actuation of the device corresponding to the charged and discharged capacitors. The voltage level of which the capacitors are charged is controlled based upon the operational status of adjacent devices of the same group.

11 Claims, 3 Drawing Sheets

MULTIPLEXER CIRCUIT

BACKGROUND OF THE INVENTION

The present invention relates to multiplexer circuits for effecting in successive phases of operation actuation of selected capacitance actuated devices arranged in respective groups.

One application of such a multiplexer circuit is a pulsed droplet deposition apparatus, such as a drop-on-demand ink jet printer having an array of channels from which ink droplets are ejected. In such a device, the ink channels may be arranged in groups, channels from the respective groups being selected for printing droplets in successive phases of operation of the multiplexer circuit. In so-called drop-on-demand printers, the actuating circuits are required to handle substantial currents which give rise to the risk of burn-out failure. Further, in known forms of pulsed droplet ink jet printers, switching of the large actuating currents typically gives rise to excessive radio frequency interference.

OBJECTS OF THE INVENTION

It is a basic object of the present invention to provide an improved actuating circuit for a pulsed droplet deposition apparatus, such as a drop-on-demand ink jet printer.

It is a more specific object of the invention to provide a multiplexer actuating circuit for a droplet deposition apparatus which operates using only relatively low power.

It is a further object of the invention to minimize the creation of radio frequency interference in such an actuating circuit.

The actuating circuit for a drop-on-demand ink jet printer of the type referred to above may be represented by a plurality of series connected capacitors, the actuating electrodes of each ink channel forming, together with the electrodes of the channels disposed on the opposite sides thereof, a pair of respective capacitors. The channels may be actuated in groups by successively disabling all but a selected group of channels, wherein a respective channel is disabled by applying zero potential to the common node between its two associated capacitors. A channel within the non-disabled group may be actuated by applying a positive potential to the common node between its two associated capacitors.

The present invention provides a multiplexer circuit for operation in the foregoing mode and in accordance with the objects stated above. The multiplexer circuit comprises a series of electrical paths connected in parallel with a signal generator, each path including a respective one of said common nodes. First and second switching means are disposed in each path and adapted to be operated by respective logic signals so that, when the first and second switching means of one path are respectively closed and open and the first and second switching means of each of the paths on respective opposite sides of the one path are respectively open and closed, charging of the two capacitors associated with the one path takes place and when, thereafter, the first and second switching means of the one path are respectively open and closed discharge of the capacitors connected to the one path takes place, thereby activating the ink channel corresponding thereto. The voltage level to which the capacitors are charged is preferably dependent upon the print status of adjacent channels of the same group.

Preferably, in each phase of operation the capacitors defining the devices selected for actuation are charged in an initial part of a voltage waveform supplied from the signal generator after which the signal generator is disconnected from the circuit for a further interval of the waveform prior to discharge of the charged capacitors. Preferably, the signal generator and the parallel electrical paths including the first and second switching means are formed in a silicon chip integrated circuit.

BRIEF DESCRIPTION OF THE DRAWINGS

The foregoing objects and other advantages of the invention will be apparent on reading the following description in conjunction with the drawings, in which.

DESCRIPTION OF THE PREFERRED EMBODIMENT

Figure 1:
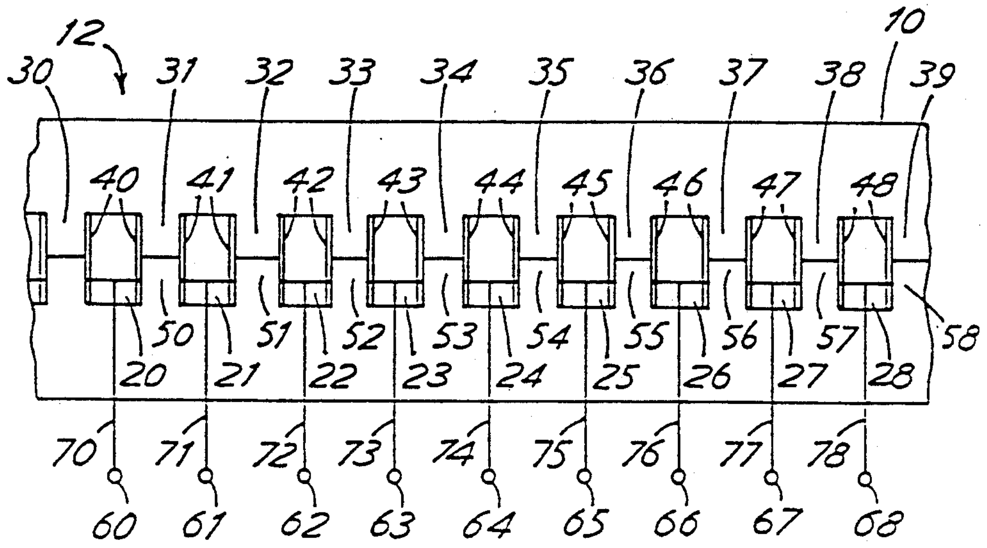
FIG. 1 illustrates a cross-section of an ink jet printhead having shear mode wall actuators as described in copending U.S. patent application Ser. No. 140,617, filed Jan. 4, 1988, entitled "Droplet Deposition Apparatus" and assigned to the assignee of the present invention.

Referring to FIG. 1, part of a print module 10 of an ink jet printhead 12 includes a multiplicity of closely spaced drop-on-demand ink drop ejectors disposed side-by-side in an array. The ejectors comprise extended parallel channels 20–28 filled with ink and separated by piezo-electric shear mode wall actuators 30–39, such as are disclosed in the previously mentioned copending application the contents of which are incorporated by reference herein.

The ink channels 20–28 have electrodes 40–48 coating the walls of each channel, which provide actuating electrodes for the wall actuators 30–39 and which, together with the wall actuators effectively form a plurality of series-connected capacitors 50–58. In particular, the electrodes associated with each channel, together with the electrodes of the channels disposed on the opposite sides thereof, form a pair of capacitors having a common node therebetween for actuating the respective channel. The common node associated with each channel is connected via a track 70–78 to a respective terminal 60–68 of a silicon chip integrated circuit described in more detail hereinafter.

As explained in the referent copending application, the ink ejectors are divided separately into two groups of odd and even numbered channels, with selected channels in the odd and even numbered groups being actuated in alternating cycles. In a typical cycle, the channels in one group (e.g. the even numbered channels) are disabled by holding their electrodes at ground potential while selected channels in the odd group are actuated for printing by applying an appropriate voltage waveform to their electrodes.

Figure 2:
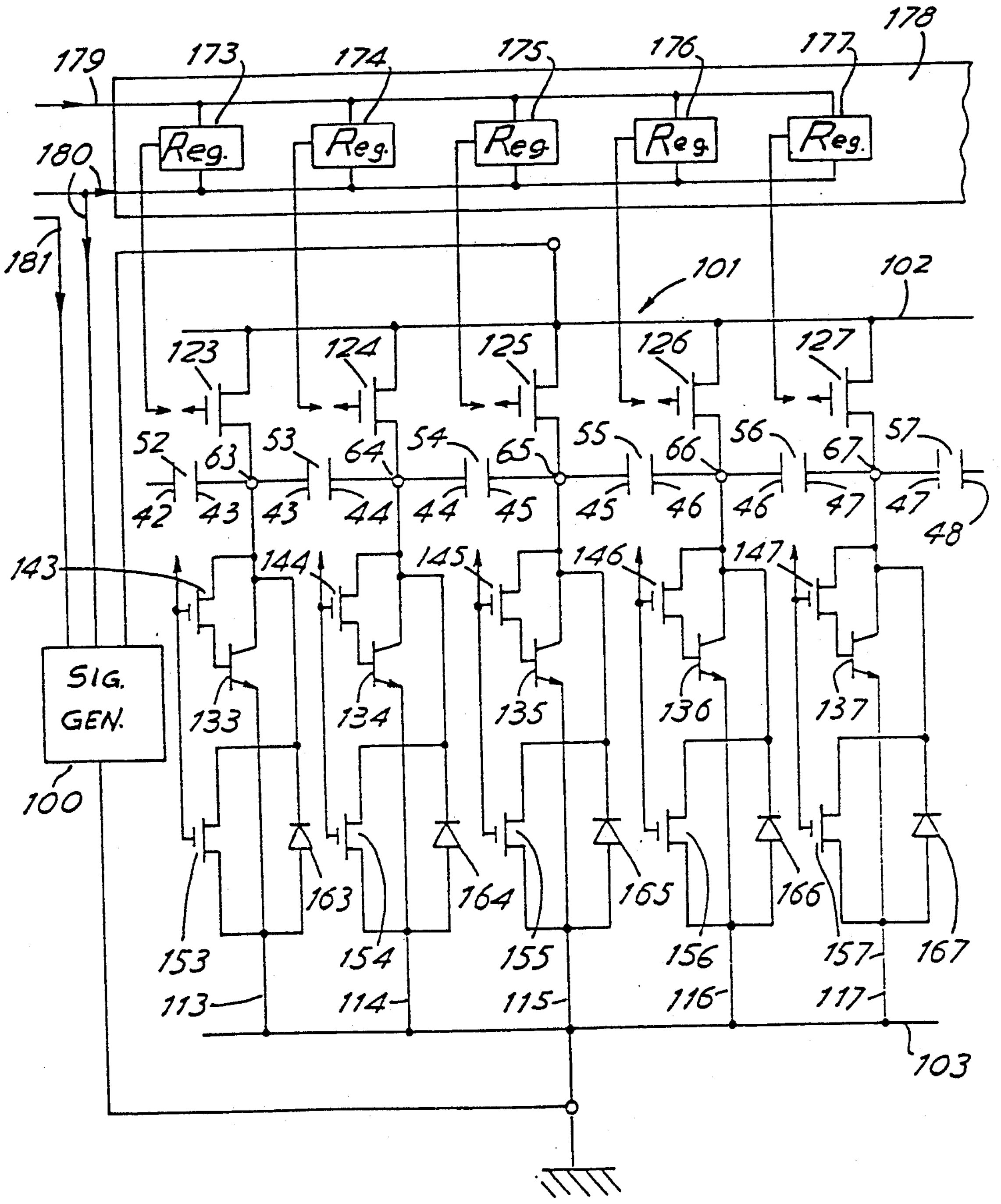
FIG. 2 illustrates one embodiment of a two phase multiplexer circuit according to the invention connected to the shear mode actuators of the printhead illustrated in FIG. 1.

One embodiment of a multiplexer drive circuit according to the invention is illustrated in FIG. 2. A signal generator 100, provided in a silicon chip integrated circuit 101 (preferably comprising a bi-CMOS design), is connected across a pair of internal buses 102 and 103, bus 102 being connected to the positive output terminal of signal generator 100 and bus 103 to the negative output terminal thereof, which is held at ground potential. Between the buses 102 and 103, there are provided a plurality of parallel electrical paths respectively associated with the actuator channels, and of which only paths 113 and 117 are illustrated. Paths 113–117 include terminals 63–67, respectively. As explained above, each of the terminals 63–67 is directly coupled to and therefore represents the common node formed between the capacitor pair associated with a respective one of the ink channels 23–27.

A plurality of field effect transistor (FET) devices 123–127 are connected between bus 102 and terminals 63–67, each in a respective path 113–117. Each FET 123–127 includes a gate electrode for receiving internally generated logic signals for operating the device as hereinafter described.

Between terminals 63–67 and bus 103, paths 113–117 respectively comprise the collector-emitter paths of n-p-n bipolar transistor devices 133–137. The base-emitter paths of transistors 133–137 respectively include FET's 143–147, each having a gate electrode for receiving an internally generated logic signal for operating the device. The collector-emitter paths of transistors 133–137 are shunted by respective FET's 153–157, the gate electrodes of which are connected to the gate electrodes of FET's 143–147 so that these devices are operated by the same logic signals that operate FET's 143–147. FET's 153–157 are themselves respectively shunted by diodes 163–167 which provide capacitor discharge paths as hereinafter described.

The logic signals for effecting and terminating conduction of transistors 123–127, 143–147 and 153–157 are supplied from a control unit comprising a plurality of registers 173–177 of a logic block 178. Logic block 178 is supplied with print pattern data on a line 179 and with relatively high frequency clock pulses on a line 180. The clock pulses from line 180 are also supplied to generator 100, which is also connected to a clock line 181 on which are supplied relatively low frequency clock pulses.

The data stream supplied on line 179 comprises an N bit pattern applied to each chip of the printhead, where N is the number of channels to which the chip is connected. The N bit pattern determines in one cycle which of the channels of the even numbered channel group are to be actuated and, in a following cycle, which of the channels of the odd numbered channel group are to be actuated. The N bit data stream additionally contains subsets n of data relating to the print status of channels of the same group as those selected for actuation on opposite sides of each of the selected channels which are to be actuated. The data subsets n may be four bit words in which case they give the print status of two channels of the same group as the selected channels on each side of each channel selected for actuation. If the data sets n are in the form of six bit words, they give the print status of three channels on each side of each channel which is to be actuated.

Upon completion of a print line and before the next pulse on line 181 is supplied to signal generator 100, the data N with its subsets n is loaded into registers 173–177 via line 179 at the rate set by the clock pulses on line 180, preferably about 10 MHz. The data sets n are sent to a look-up table in a ROM (not shown) which sends digital signals respectively determined by the data sets n to registers 173–177, which signals are stored in the registers and employed to define a count of pulses on line 180. The count determines the level of charging of the capacitors of each actuated channel.

The voltage cycles applied by signal generator 100 across buses 102 and 103 are initiated by the pulses on clock line 181. Upon initiation of each such cycle the data stored in registers 173–177 selects for printing selected channels of one of the channel groups by switching on transistors 123–127 and switching off transistors 143–147 of the selected channels. As explained hereinafter, this results in charging of the capacitors of the selected channels. Charging is subsequently terminated by switching off transistors 123–127 of the selected channels when the charging voltage developed across the associated capacitors reaches a value corresponding to the count determined by the digital signals stored in the respective registers 173–177. It will be appreciated that the registers of each of the end channels of modules making up the printhead receive subsets n of bits from the ROM which provide the print status of adjoining channels spanning the butted region of the module in which the end channel concerned is located and the adjoining module.

In accordance with the foregoing, cross-talk due to channel wall compliance, i.e. the effect in an actuated channel of pressures existing in neighboring channels can be compensated for electrically. This is achieved as described above by charging the capacitors of each selected channel for a time period to provide a voltage level across the capacitors dependent upon the selected or non-selected status of a number of adjacent channels of the group containing the selected channel. In particular, the level of the charging voltage of a selected channel is preferably directly related to the number of adjacent channels of the same group selected for actuation.

Figure 4:
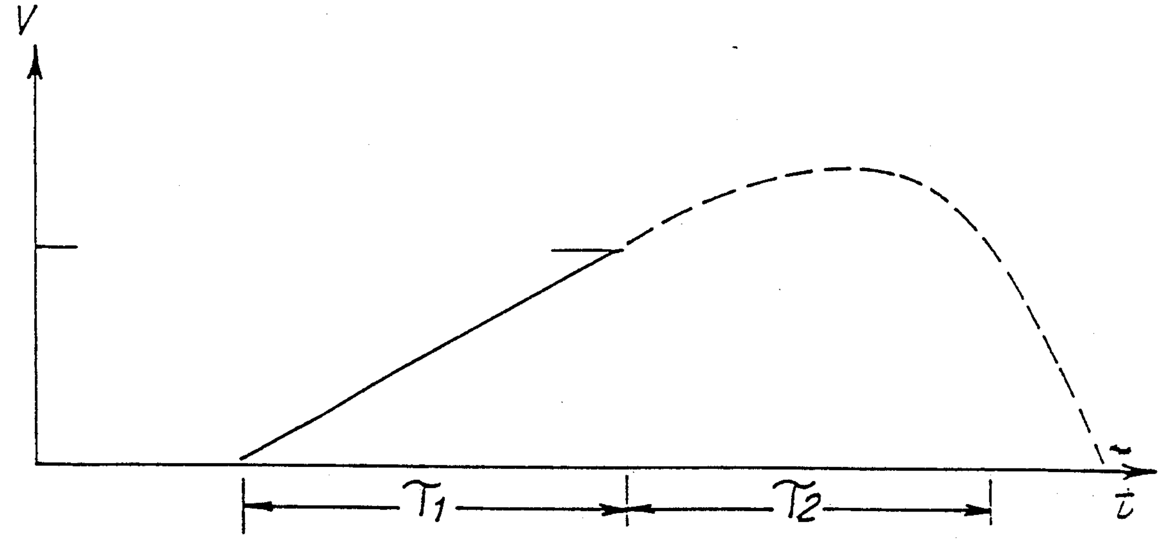
FIG. 4 illustrates a preferred voltage waveform for operation of the ink jet printhead of FIG. 1 employing the circuit of either FIG. 2 or FIG. 3.

FIG. 4 illustrates the waveform provided by signal generator 100 to energize the actuator walls 30–39 during successive phases of the multiplexer circuit of FIG. 2. The waveform consists of a charge period T1 during which the charge on selected ones of the capacitors 52–57 gradually rises to predetermined values for each selected channel of the active group. The capacitors are then disconnected from the signal generator and remain at or substantially at their charged voltage level for a further "hold" period T2. During period T2 the signal voltage is maintained at least at the level of the charge voltage. As shown, the signal voltage during period T2 is allowed to first rise above and at the end of the period to return to the charge voltage. After the period T2 the signal voltage falls to zero to enable reconnection of the signal generator to the capacitors for the next phase of operation. Before that commences a rapid discharge of the charged capacitors, as hereinafter described, is effected.

In the charge period T1, the wall actuator electrodes of selected channels of, say, the odd numbered channels 21–27 are energized to cause the wall actuators to deform outwards from the channels into a chevron or cantilever form as described in the referent copending patent application due to the charge voltage and the direction of polarization of the wall actuators. The rate of rise of voltage is however gradual so that the magnitude of the acoustic waves formed in the ink channels only mildly disturbs the ink menisci in the ejection nozzles of the channels and is not sufficient to eject drops of ink from the nozzles of the even numbered channels adjacent the actuated odd numbered channels. The charge period T1 exceeds the time of travel of acoustic waves in the actuated channels so that T1>>L/C, where L is the channel length and C is the acoustic wave velocity in the channels.

During the hold period T2, further ink is drawn into the actuated odd numbered channels by the action of the acoustic waves and this causes the channel wall actuators to relax outwardly as the ink quantity in the channels increases. After the hold period T2, typically about L/C, the pressure of ink in the selected channels is a maximum and the capacitors of those channels are then rapidly discharged to cause rapid inward movement of the channel actuator walls which generates pressure waves in the selected channels causing ejection of an ink drop from the nozzles of those channels. After replenishment of ink in the channels from which ink drop ejection has taken place, the next phase of operation is effected on selected even numbered channels by a further signal phase of the signal generator.

The detailed operation of the drive circuit of FIG. 2 will now be described. In the quiescent state of the circuit, FET's 143–147 and FET's 153–157 are all held in a conducting condition in response to internally generated logic signals applied to their gate electrodes. At the same time, FET's 123–127 are held in a non-conducting condition. Assuming now that channel 25 is one of the group of odd numbered channels to be selected for activation, at the commencement of the charge period T1 of the signal from the signal generator 100, which is initiated by a pulse on line 181, FET 125 is rendered conductive by an internally generated logic signal applied to its gate by register 175, while FET's 124 and 126 are rendered non-conductive for disabling the corresponding even numbered channels. Also, the signal at the gate electrodes of FET's 145 and 155 is removed to render those devices non-conducting. Capacitors 54 and 55 therefore, relatively slowly, charge to the predetermined voltage during the charge period T1, the predetermined voltage being determined by the signal from the ROM stored in register 175. The charging path for capacitor 54 comprises FET's 125 and 154 and the charging path for capacitor 55 comprises FET's 125 and 156. The actuator walls 35 and 36 of channel 25 accordingly move outwards to allow ink to flow into that channel. Because of the slow rate of charge, no ink drops are expelled from the adjoining channels.

During the hold period T2, the logic signal applied to FET 125 is turned off disconnecting the actuators from the drive signal generated by signal generator 100.

Firing, that is to, say, discharge of capacitors 54 and 55, is initiated at the end of hold period T2 and is effected by applying a signal from register 175 (after a predetermined count of pulses on line 180) to the gate electrodes of FET's 145 and 155 rendering bipolar transistor 135 conductive. This establishes a discharge path for capacitor 55 comprising transistor 135 and diode 166. Also, a discharge path for capacitor 54 is established comprising transistor 135 and diode 164. Although during discharge both FET's 145 and 155 are conducting, because of the relative resistances of bipolar transistor 135 and FET 155 most of the discharge current flows through transistor 135. It will be noted that there is no common ground circuit through which the discharge currents are summed after discharging the piezo-electric actuators. In circuits in which the impulsive (drive or discharge) currents are routed in a common return loop, which are commonly used in prior art ink jet drive systems, circuits to handle very substantial currents (64 or 128×100 ma) have to be constructed. Such current magnitudes with frequent oepration present a substantial risk of burn-out failure.

It will be noted that the discharge currents of capacitors 54 and 55 flow through transistor 135 and divide equally between diodes 164 and 166 and that these relatively high discharge currents flow respectively in clockwise and counter-clockwise paths so that the electromagnetic effects thereof effectively cancel thus minimizing radio frequency interference. In other words, the discharge currents flow and return in parallel closely spaced tracks in dipole pairs, in which the magnetic fields from the discharge currents substantially cancel. This reduces the magnitude of magnetic radiation to be expected very significantly compared with that generated in common ground return loop circuits.

The heating effect of current in circuit 101 is largely confined to the capacitor discharge currents and therefore to the turn on time of bipolar transistors 133–137, which typically lasts about 30 nanoseconds. Also, typically, discharge of capacitors 54 and 55 takes place in about 2 microseconds causing currents typically on the order of about 100 ma and resulting in rapid return of the actuator walls of channel 25 to their relaxed positions thereby developing ink drop ejection pressure in channel 25. Similar discharges firing all the odd numbered channels activated in the same phase of the operation takes place at the same time as the discharge of capacitors 54 and 55. In the next cycle of operation, the same voltage waveform is applied to the electrodes of the walls of the even numbered channels selected for actuation, the actuators of the odd numbered channels being disabled by shutting off FET's 123–127 associated therewith.

It will be observed that each channel in both the even and odd numbered groups is operated with voltage signals of the same polarity, which can be selected according to the poling direction of the ceramic in the piezo-electric actuator. A drive chip having a single polarity of drive circuits made up of only, for example, p-type components is less expensive in construction than a bipolar chip where both p and n type are required. It will also be observed that the connecting tracks 70–78 joining the drive circuit to the actuators have a density of one track per ink channel, despite the fact that the two actuators that operate each channel have three drive tracks connected to operate them. Thus, for example, channel 25 connects with the drive circuit by way of track 75 but the actuator walls of that channel require tracks 74, 75 and 76 to operate them.

Figure 3:
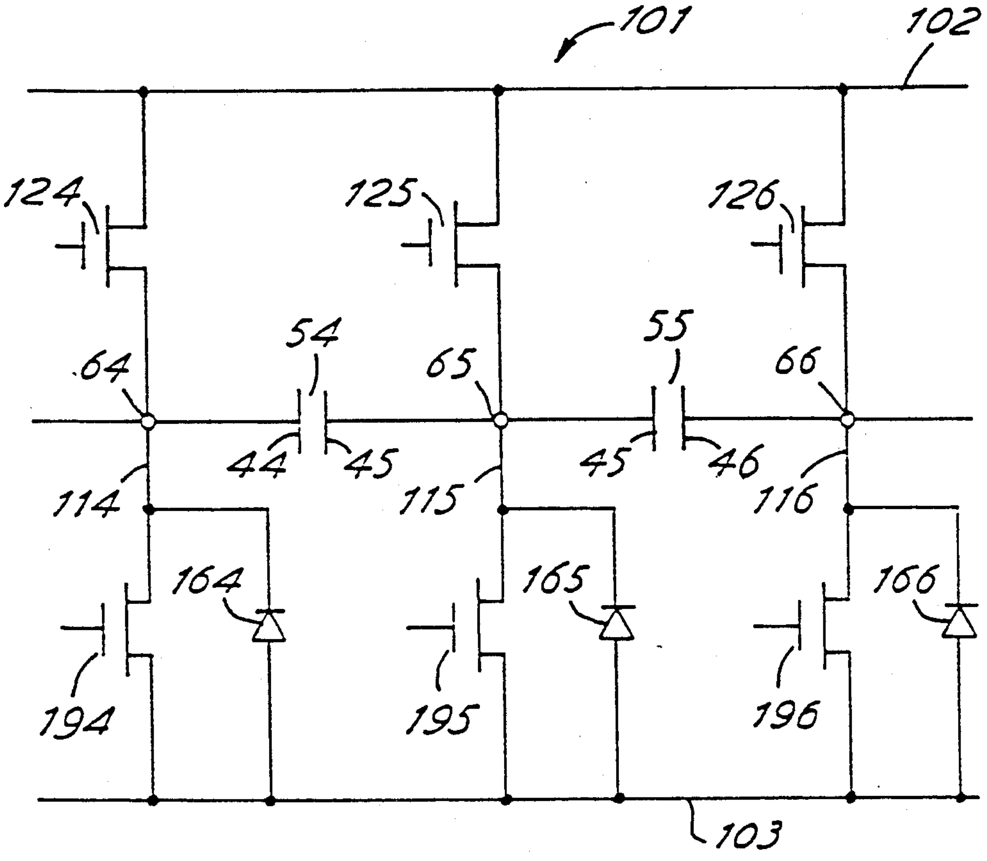
FIG. 3 illustrates a further embodiment of a two phase multiplexer circuit for use with the shear mode actuators of FIG. 1.

FIG. 3 shows a fragment of an alternative embodiment of a multiplexer circuit according to the invention which is of CMOS design. It will be seen that in the parallel paths 114, 115, 116, the diodes 164–166 now shunt respective FET's 194, 195, 196. The requisite logic signals for effecting operation of the circuit are the same as for the circuit of FIG. 2 and are not shown.

In the quiescent state, FET's 124–126 are in a non-conducting condition and devices 194–196 are held in a conducting state by logic signals applied to their gate electrodes. In the first phase of the operation of the circuit, assuming that channel 25 is chosen as one of the odd numbered channels for activation, capacitors 54 and 55 are charged during period T1 by reason of a logic signal being applied to the gate electrode of FET 125 from register 175, and the signal at the gate electrode of FET 195 is removed. This results in capacitor 54 being charged through FET's 125 and 194 and capacitor 55 being charged through FET's 125 and 196. At the end of period T1 (determined by the signal from the ROM stored in register 175), the logic signal at the gate electrode of FET 125 is removed to terminate charging of capacitors 54 and 55 at a level determined by the print status of channels on opposite sides of channel 25 which belong to the same group. Subsequently, after the holding period T2, a logic signal is applied to the gate electrode of FET 195 to render that device conductive and thereby to discharge capacitors 54 and 55. Capacitor 54 discharges through FET 195 and diode 164 and capacitor 55 discharges through FET 195 and diode 166. It will be apparent that this circuit has the same advantageous features as were referred to in connection with the circuit of FIG. 2.

It will further be apparent to those skilled in the art that although the embodiments of the invention described with reference to FIGS. 1, 2 and 4 and FIGS. 1, 3 and 4 require that the printhead channels be arranged in two groups of interleaved channels with the channels of one group alternating with those of the other group, it is quite feasible to employ arrangements having more than two groups of channels. Thus in an arrangement where there are, say, three groups of interleaved channels, the circuits described would have, instead of the two phases of operation described for the circuits of FIGS. 2 and 3, three phases of operation in which selected channels of the respective groups would be actuated and there would therefore be at least two inactive channels between any two simultaneously actuated channels. For a given density of channels, the greater the number of groups the less acute the problem of cross-talk becomes. The time required to effect printing of a print line however becomes greater and this may complicate the printhead design because of the need to spatially offset the nozzles of each group from those of the other groups. In the highest density of channels likely to be achievable it is envisaged that wall compliance will be such as to require cross-talk to be limited by both grouping of channels and compensation of the charging voltages of the channel capacitors in dependence upon the print status of adjoining channels.

It is recognized that numerous changes and modifications in the desired embodiment of the invention may be made without departure from its true spirit and scope. For example, it will be apparent to those skilled in the art that the switch devices of the integrated circuit could include instead of field effect and bipolar transistors, silicon controlled rectifiers, four layer diodes or other forms of semiconductor switch devices. The invention is to be limited only as defined in the claims.

What is claimed is:

1. A multiplexer circuit for effecting, in successive phases of operation, actuation of selected capacitance actuated devices arranged in respective groups, said devices being represented by a plurality of series-connected capacitors with each device corresponding to a pair of successive capacitors, each of said successive capacitor pairs defining a common node therebetween, comprising:

signal generator means for providing a charging signal;

a plurality of parallel electrical paths each connected across said signal generator means, each of said paths including the common node formed by the capacitor pair corresponding to a respective one of said devices and first and second switching means connected on opposite sides of said common node; and control means initially operable for respectively closing and opening the first and second switching means of one of said paths and respectively opening and closing the first and second switching means of the paths adjacent thereto for establishing a flow of current in response to said charging signal for charging the two capacitors connected to said one path, and subsequently operable for respectively opening and closing the first and second switching means of said one path for discharging said two capacitors;

thereby to effect actuation of the device corresponding to said two capacitors.

2. A multiplexer circuit according to claim 1 including current steering means connected to each of said second switching means for discharging said two capacitors by effecting respective discharge currents in said paths adjacent said one path which flow in respective clockwise and counter-clockwise senses.

3. A multiplexer circuit according to claim 2 wherein said current steering means comprise diode means connected across said second switching means of each of said paths for providing capacitor discharge paths in each of the paths adjacent the path associated with an actuated one of said devices.

4. A multiplexer circuit according to claim 3 wherein said control means comprises logic means for applying respective control signals to said first and second switching means for effecting charging of the capacitors corresponding to each of said devices selected for actuation for a period dependent upon the actuated or non-actuated status of the devices adjacent each of said selected devices.

5. A multiplexer circuit according to claim 3 wherein each of said first and second switching means comprises a transistor switch which, together with said diode means, are embodied in a silicon chip integrated circuit.

6. A multiplexer circuit according to claim 3 wherein each of said second switching means comprises first and second switches, said first and second switches providing parallel capacitor charging paths in the paths adjacent each path associated with an actuated one of said devices, said second switch further providing a capacitor discharge path for discharging both capacitors associated with an actuated one of said devices.

7. A multiplexer circuit according to claim 6 wherein said first and second switching means are embodied in a silicon chip integrated circuit, said first switching means comprising a field effect transistor and said first and second switches comprising respectively a field effect transistor and a field effect transistor controlling the operation of a bipolar transistor.

8. A multiplexer circuit according to claim 3 wherein said signal generator means provides a slowly increasing voltage for charging the capacitors associated with actuated ones of said devices and is subsequently disconnected therefrom for a finite interval prior to the discharge of said charged capacitors.

9. A multiplexer circuit for effecting, in successive phases of operation, actuation of selected capacitance actuated devices arranged in respective groups, said devices being represented by a plurality of series-connected capacitors with each device corresponding to an adjacent pair of said capacitors, each of said adjacent capacitor pairs defining a common node therebetween, comprising:

signal generator means for providing a charging signal;

a plurality of parallel electrical paths each connected across said signal generator means, each of said paths including the common node formed by the capacitor pair corresponding to a respective one of said devices and first and second switching means connected on opposite sides of said common node; and control means initially operable for respectively closing and opening the first and second switching means of one of said paths and respectively opening and closing the first and second switching means of the paths adjacent thereto for establishing a flow of current in response to said charging signal for charging the two capacitors connected to said one path, and subsequently operable for respectively opening and closing the first and second switching means of said one path for establishing a pair of circuits comprising said second switching means of said one path and the paths adjacent thereto in which are developed respective clockwise and counter-clockwise discharge currents for discharging said two capacitors;

thereby to effect actuation of the device corresponding to said two capacitors.

10. A multiplexer circuit according to claim 9 wherein each of said second switching means comprises a transistor switch and a diode connected in parallel thereacross.

11. A multiplexer circuit according to claim 9 wherein said control means comprises logic means for applying respective control signals to said first and second switching means for effecting charging of the capacitors corresponding to each of said devices selected for actuation for a period dependent upon the actuated or non-actuated status of the devices adjacent each of said selected devices.

* * * * *